(12) United States Patent
Song et al.

(10) Patent No.: US 8,376,032 B2
(45) Date of Patent: Feb. 19, 2013

(54) SYSTEMS AND METHODS FOR PROVIDING TWO PHASE COOLING

(75) Inventors: Seaho Song, Kanata (CA); Jesse Jaejin Kim, Sunnyvale, CA (US)

(73) Assignee: Vapro Inc., Menlo Park, CA (US)

( * ) Notice: Subject to any disclaimer, the term of this patent is extended or adjusted under 35 U.S.C. 154(b) by 1553 days.

(21) Appl. No.: 11/588,199

(22) Filed: Oct. 24, 2006

(65) Prior Publication Data

US 2008/0093053 A1    Apr. 24, 2008

(51) Int. Cl.
*F28D 15/00*    (2006.01)
*F28D 1/04*    (2006.01)
*F28D 11/00*    (2006.01)
*H05K 7/20*    (2006.01)

(52) U.S. Cl. .............. 165/104.21; 165/80.4; 165/104.33; 165/151; 361/700

(58) Field of Classification Search ............. 165/104.21, 165/104.33, 151; 361/700
See application file for complete search history.

(56) References Cited

U.S. PATENT DOCUMENTS

| | | | | |
|---|---|---|---|---|
| 2,045,657 | A * | 6/1936 | Karmazin | 165/151 |
| 2,133,990 | A * | 10/1938 | Karmazin | 29/890.039 |
| 4,423,771 | A * | 1/1984 | Frederick | 165/151 |
| 4,958,681 | A * | 9/1990 | Kadle | 165/151 |
| 5,806,583 | A * | 9/1998 | Suzuki et al. | 165/104.33 |
| 5,814,392 | A | 9/1998 | You et al. | |
| 6,462,410 | B1 | 10/2002 | Novotny et al. | |
| 6,725,908 | B2 * | 4/2004 | Suzuki | 165/104.21 |
| 6,972,950 | B1 | 12/2005 | Wyatt et al. | |
| 2004/0026073 | A1 * | 2/2004 | Alex et al. | 165/182 |

OTHER PUBLICATIONS

Satish C. Mohapatra, Dynalene, Inc. "An Overview of Liquid Coolants for Electronics Cooling" at http://electronics-cooling.com/html/2006_may_a2.html.

* cited by examiner

*Primary Examiner* — Brandon M Rosati
(74) *Attorney, Agent, or Firm* — Tran & Associates

(57) ABSTRACT

A heat sink includes a first housing adapted to receive a coolant in a first phase; one or more fins stacked on the first housing, the one or more fins having openings there-through to receive a second phase of the coolant; and a second housing coupled to the one or more fins to define an internal chamber.

10 Claims, 3 Drawing Sheets

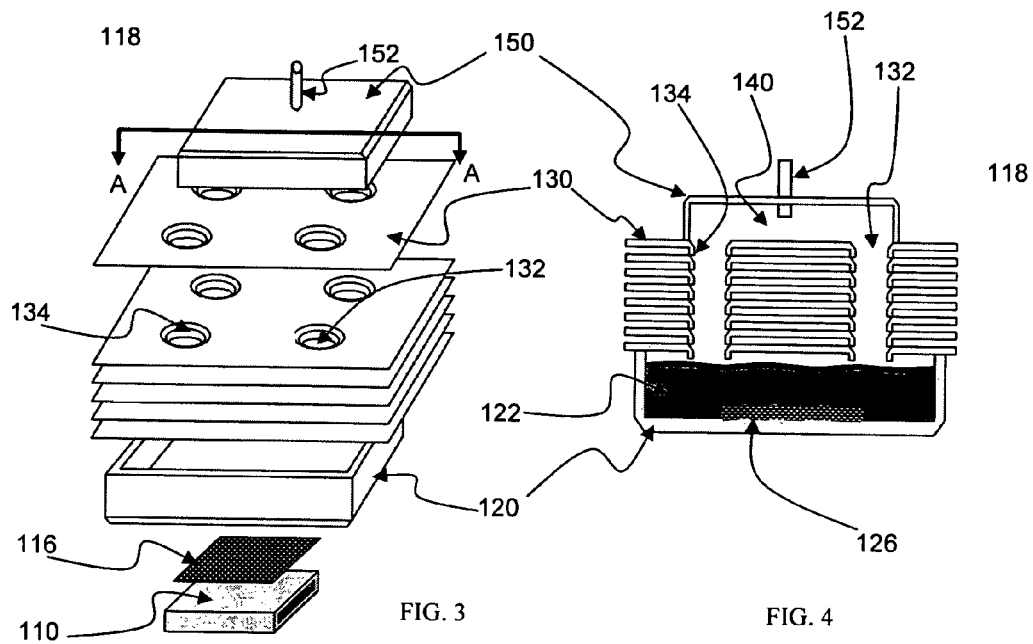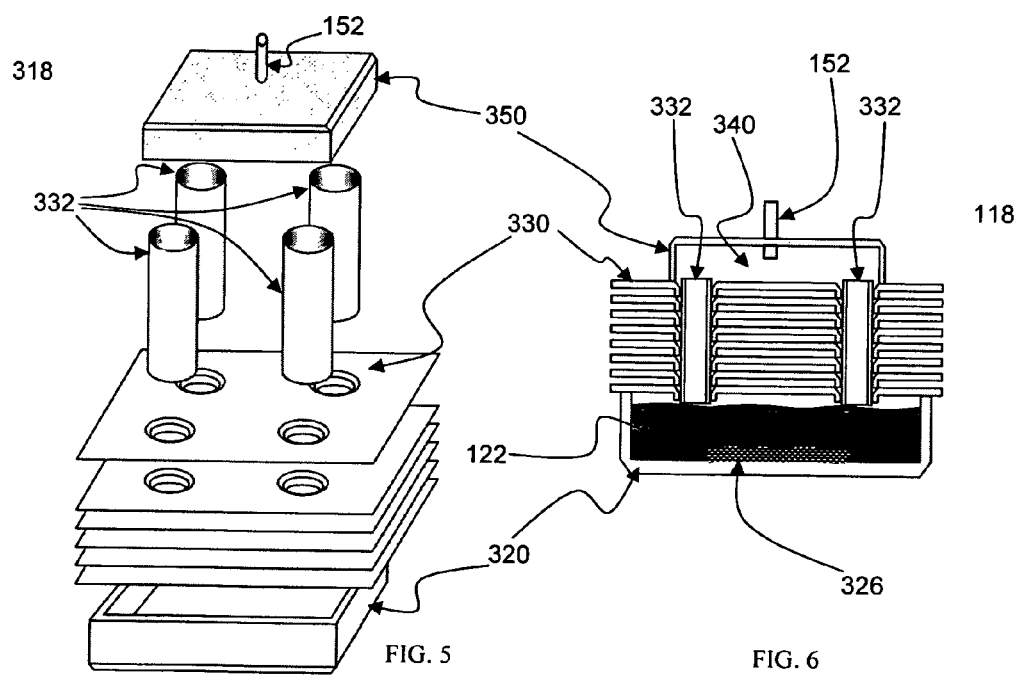

providing a coolant in a bottom housing, the coolant being a first phase (200)

receiving the coolant in a second phase in an internal chamber defined by one or more fins stacked above the bottom housing and a top housing positioned above the one or more fins (210)

applying a boiling enhancement coating on one surface of the bottom housing (220)

FIG. 7

SYSTEMS AND METHODS FOR PROVIDING TWO PHASE COOLING

This invention relates to heat dissipation of an integrated circuit (IC) device.

Advanced computational capability requires increased electronic signal speed, and this requirement is forcing the electronics industry to design miniaturized, highly integrated, high-density packaging of electronic components, all of which lead to higher component surface temperatures and elevated energy dissipation rates at the chip, module, and system levels. As the desire for processing intensive applications increases, so does the demand for electrical systems that operate at faster speeds, occupy less space, and provide more functionality. To meet these demands, manufacturers design increasingly more powerful modules containing numerous components residing in relatively close proximity on a common substrate (e.g., an integrated circuit board). With increasing heat dissipation from microelectronics devices and reduced overall form factors, thermal management becomes increasingly important because both performance reliability and life expectancy of electronic equipment are inversely related to the component temperature of the equipment. Long life and reliable performance of a device, therefore, may be achieved by effectively controlling the device operating temperature. A typical worst-case operating temperature for a complex electronic device such as a microprocessor or an application specific integrated circuit (ASIC) device is 105 degrees Celsius.

Heat dissipation is a well-known technique for controlling operating temperatures. Heat dissipation may be accomplished in various ways such as transferring the heat to a heat-conducting medium, for example, air or liquid coolant. Due to the expense and complexity associated with active liquid cooling systems, air is typically used as the cooling medium. However, liquid cooling has the advantages of higher cooling capacity, lower junction temperature and more compact size.

Dissipation of heat, either by air or liquid, often requires a series of physical interfaces to provide a thermally conductive path. These interfaces typically offer minimum resistance to heat flow and provide electrical isolation. In many applications, dissipation of the heat is aided by the use of heat spreaders and heat sinks, as shown in FIG. 1.

In FIG. 1, a heat sink 22 is attached to an integrated circuit device package 10 via an adhesive 20. Integrated circuit device package 10 contains an integrated circuit die 14 with circuitry components 12 formed thereon. A heat spreader/lid 18 is attached to integrated circuit die 14 on the opposite side of components 12 with an adhesive 16. An integrated circuit device package body 26 encloses/encapsulated integrated circuit die 14. Pins 28 provide electrical connection between integrated circuit die 14 and external circuitry (not shown). The heat generated by the operation of components 12 is dissipated to cooling medium 24 through heat spreader/lid 18, adhesives 16 and 20 and heat sink 22. For an air-moving cooling system, a fan (not shown) blows air onto heat sink 22 to transfer heat from heat sink 22 to the air in the surrounding atmosphere.

Heat sink 22 typically has substantially planar surfaces 22a and 22b and uniform thickness. In addition, traditional heat sinks are typically attached to the surface of package 10 which typically has a substantially planar surface 10a. Thus, heat sink 22 typically reduces the temperature uniformly throughout die 14. However, the various circuitry components 12 often generate different amounts of heat due to various power dissipation levels of components 12. The non-uniformity of heat dissipation causes temperature gradient/variation from one region to another on die 14. Temperature gradient is undesirable because it can result in adverse thermal gradients, causing excessive thermal stress and timing issues.

Heat sink 22 and heat spreader/lid 18 are often constructed from copper tungsten (CuW) or aluminum silicon carbide (AlSiC) which has a thermal conductivity of approximately 200 W/meter.multidot.K. Copper tungsten or aluminum silicon carbide may not provide adequate thermal conductivity for high performance integrated circuit devices. High conductivity structural materials may be created using composites which are materials having two or more different materials bonded together.

FIG. 2 shows an IC device with a composite heat dissipation structure which is composed of three layers. Specifically, composite heat dissipation structure 54 is composed of, e.g., a 0.5 mm thick lower layer 54a, a 0.5 mm thick upper layer 54c, and a 0.5 mm thick middle layer 54b sandwiched in between. Lower layer 54a and upper layer 54c are constructed from aluminum silicon carbide (AlSiC) which provides strength and stiffness to the structure. Middle layer 54b is constructed from high grade graphite such as K 1100 manufactured by Amoco which enhances heat dissipation of the structure. High grade graphite structure is typically constructed by layering high conductivity fibers, thus yields anisotropic properties which may be undesirable. For example, the high grade graphite structure has high thermal conductivity in the longitudinal direction (e.g., approximately 1600 W/mK) but poor thermal conductivity in the vertical direction (e.g., approximately 10 to 20 W/mK). As a result, high graphite is a good material in spreading heat along the structure in the longitudinal direction but is a poor conductor in transferring heat vertically to the surface of the heat dissipation structure. Composite heat dissipation structure 50 also does not provide compensation for temperature gradients. As such, the temperature gradient can result in unacceptable maximum junction temperature, causing excessive thermal stress and timing issues and thereby resulting in fatigue and mechanical failure and speed limitations of the integrated circuit device.

U.S. Pat. No. 6,462,410 describes an integrated circuit device including an integrated circuit die having first and second heat-generating components formed thereon, and a heat dissipation structure thermally coupled to the die to dissipate heat generated by the components. The heat dissipating characteristics of the heat dissipation structure are tailored to match the heat generated by each of the first and second components.

SUMMARY

In a first aspect, a heat sink includes a bottom housing adapted to receive a coolant in a first phase; one or more fins stacked above the bottom housing, the one or more fins having openings therethrough to receive a second phase of the coolant; and a top housing positioned above the one or more fins to define an internal chamber.

In another aspect, a heat sink includes a first housing adapted to receive a coolant in a first phase; one or more fins stacked on the first housing, the one or more fins having openings there-through to receive a second phase of the coolant; and a second housing coupled to the one or more fins to define an internal chamber.

Implementations of the above aspect(s) may include one or more of the following. A boiling enhancement coating can be formed on one surface of the bottom housing. The boiling enhancement coating can form micro-cracks. The first phase can be a liquid phase, while the second phase can be a vapor phase. The coolant can be water. Each opening can be a cold-drawn lip. The fins and the internal chamber are integral, wherein the bottom housing, the one or more fins, and the top housing are joined using one of: brazing, soldering, gluing, or mechanical joining (such as folding or pressing, among others).

In another aspect, a method to remove heat includes providing a coolant in a bottom housing, the coolant being a first phase; receiving the coolant in a second phase in an internal chamber defined by one or more fins stacked above the bottom housing and a top housing positioned above the one or more fins.

In another aspect, a method to remove heat includes providing a coolant in a first housing, the coolant being a first phase; and receiving the coolant in a second phase in an internal chamber defined by one or more fins stacked between the first housing and a second housing.

Implementations of the method(s) can include one or more of the following. The method includes applying a boiling enhancement coating on one surface of the bottom housing. The boiling enhancement coating can form micro-cracks. The first phase comprises a liquid phase, while the second phase comprises a vapor phase. The coolant can be water. The method includes forming a drawn lip through each opening. The fins and the internal chamber are integral and can be made by joining the bottom housing, the one or more fins, and the top housing using one of: brazing, soldering, gluing, or mechanical joining (folding, pressing, etc.).

Due to the integral nature of external fin and internal chamber, thermal interface is eliminated (thus enhancing thermal performance). Further, when sheet metal parts are brazed (soldered or glued, or mechanical joining (folding, pressing, etc.).) together, the joining material it self becomes structural weight supporting elements, thus allowing fabrication of internal chamber and the integral fin to be made with a thin material, therefore yielding a very light module. The total part count of the module can be as low as three and all parts can be joined together through one process whether brazing, soldering or gluing, or mechanical joining (folding, pressing, etc.). The resulting heat sink is light and low-cost. The head sink 118 may be manufactured by various processes (e.g., stamping, casting) and made from various materials (e.g., aluminum, copper, bronze). Generally, heat sink 118 should be constructed such that it has a high coefficient of thermal conduction and is of a shape that is adapted to convect or radiate heat at a high rate.

Other ways of tailoring the heat dissipating characteristics of the heat dissipation member, such as altering the heat-dissipating characteristics of the intervening layers, are also contemplated.

Additional heat dissipation members may be added to the structure with tailored heat-dissipating characteristics to further normalize the temperature of the integrated circuit die. The above techniques may be utilized for single-chip or multiple-chip packages.

This summary is not intended to limit the scope of the invention which is defined solely by the claims attached hereto.

BRIEF DESCRIPTION OF THE DRAWINGS

FIG. 3 shows a perspective view of an exemplary heat sink or heat dissipation system.

FIG. 4 shows a cross-sectional view of the heat sink or heat dissipation system of FIG. 3.

FIG. 5 shows a perspective view of a second exemplary heat sink or heat dissipation system.

FIG. 6 shows a cross-sectional view of the heat sink or heat dissipation system of FIG. 5.

FIG. 7 shows an exemplary process for fabricating a heat sink.

DESCRIPTION

Figure 1:
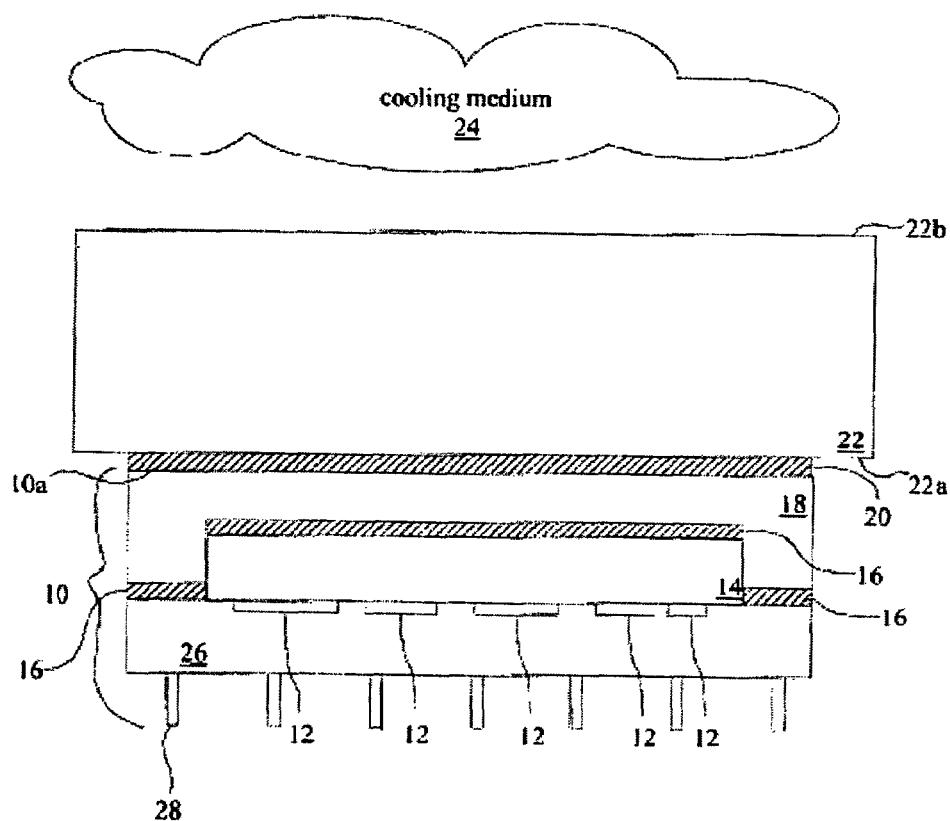
FIG. 1 shows a conventional heat sink or heat dissipation system according to the prior art.
Figure 2:
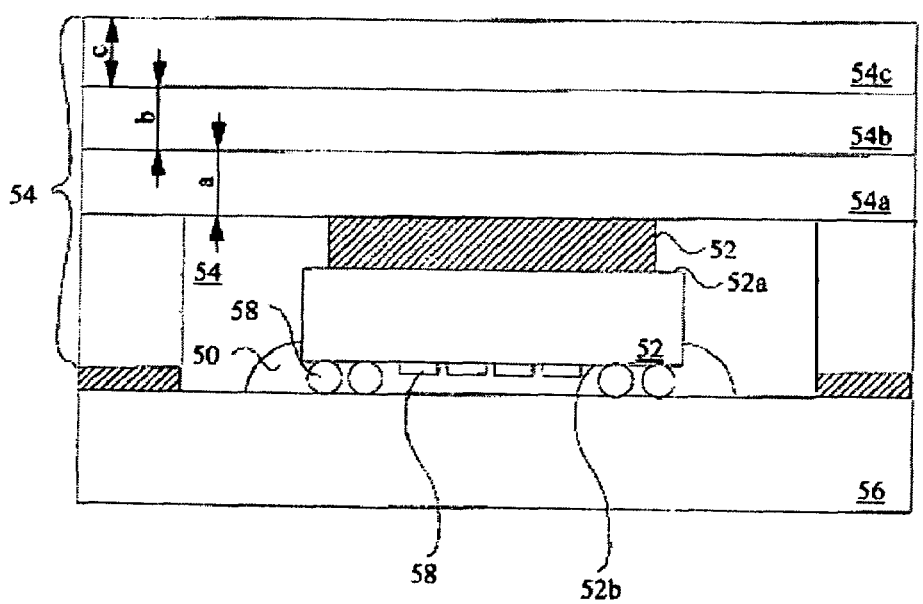
FIG. 2 shows a conventional composite heat sink or heat dissipation structure according to the prior art.

FIG. 3 shows a perspective, exploded view of a heat dissipation system in accordance with the present invention, while FIG. 4 shows a cross-sectional view of the heat dissipation system shown in FIG. 3, taken along line A-A'.

Turning now to FIG. 3, an electronic device package 110 contains a semiconductor die having circuit components formed thereon (not shown). Die may be, for example, a microprocessor or application specific integrated circuit (ASIC), with components being processing blocks or sub-blocks (such as a Memory Management Unit (MMU), or Arithmetic Logic Unit (ALU), for example), of the overall circuitry. Circuit components may be any other component of an integrated circuit, such as arrays, peripheral circuitry, registers, power circuits, transistors, resistors, capacitors, and so forth. Semiconductor die may be made of, for example, silicon or gallium arsenide. Circuit components are formed on an active side of semiconductor die via conventional semiconductor processing means.

During electrical operation of integrated circuit device 110, circuit components may generate heat. The heat generated by each of circuit components may vary from component to component, depending on the type of components, the components' use in the overall integrated circuit, the size of the components, etc. This variance in heat generation results in differences in the heat generation level from region to region on semiconductor die. The semiconductor die is encapsulated in device package 110 which may be any type of semiconductor device package, including for example, lead frame and package cases (e.g., flip-chip, Ball Grid Array (BGA), etc.). Device package 110 contains semiconductor die and provides electrical connectivity between semiconductor die and external circuits. A heat sink or heat dissipation structure 118 is mounted on the surface of the device package 110 and can be thermally coupled to the device 110 through an interface material 116.

The heat sink 118 enhances heat dissipation from a hot surface, e.g., electronic device package 110, to a cooler ambient, e.g., air, by increasing the surface area that is in direct contact with the cooling medium. The primary purpose of heat sink 118 is to maintain the device temperature below the maximum allowable temperature specified by the device manufacturer.

In accordance with the embodiment of FIGS. 3-4, the heat sink 118 includes a bottom housing or tub 120. Further, a plurality of sheets forming fins 130 are positioned above the tub or bottom housing 120. The bottom housing can receive a coolant 122 existing in a first phase, in one case a liquid. The fins 130 are stacked above the bottom housing and have openings 132 there-through to receive a second phase of the coolant 122. The space defined by the stacked openings 132 are sealed by a top housing or lid 150 positioned above the one or more fins 130 to define an internal chamber 140.

A boiling enhancement surface 126 is provided on an inner surface of the bottom housing 120. The boiling enhancement surface forms micro-cracks and provide more space to dissipate heat. In one embodiment, the boiling enhancement is providing using a boiling enhancement coating. Other non-coating surface enhancements such as scratches, machining, or sintering, can be used as a boiling enhancement surface to effect heat removal.

The first phase of the coolant 122 can be a liquid phase and the second phase can be a vapor phase. The coolant 122 can be water or any suitable coolant. Non-Dielectric liquid coolant such as water is preferred due to low cost and low environmental issues. Dielectric liquid coolants can also be used. Aromatics coolant such as synthetic hydrocarbons of aromatic chemistry (i.e., diethyl benzene [DEB], dibenzyl toluene, diaryl alkyl, partially hydrogenated terphenyl) can be used. Silicate-ester such as Coolanol 25R can be used. Additionally, common alcohol such as methanol and ethanol can be used as well. Aliphatic hydrocarbons of paraffinic and iso-paraffinic type (including mineral oils) can be used as well. Another class of coolant chemistry is dimethyl- and methyl phenyl-poly (siloxane) or commonly known as silicone oil—since this is a synthetic polymeric compound, the molecular weight as well as the thermo-physical properties (freezing point and viscosity) can be adjusted by varying the chain length. Silicone fluids are used at temperatures as low as $-100°$ C. and as high as $400°$ C. These fluids have excellent service life in closed systems in the absence of oxygen. Also, with essentially no odor, the non-toxic silicone fluids are known to be workplace friendly. However, low surface tension gives these fluids the tendency to leak around pipe-fittings, although the low surface tension improves the wetting property. Similar to the aliphatics, high molecular weight silicone oils have also found applications in cooling transformers. Fluorinated compounds such as perfluorocarbons (i.e., FC-72, FC-77) hydrofluoroethers (HFE) and perfluorocarbon ethers (PFE) have certain unique properties and can be used in contact with the electronics.

Non-dielectric liquid coolants offer attractive thermal properties, as compared with the dielectric coolants. Non-dielectric coolants are normally water-based solutions. Therefore, they possess a very high specific heat and thermal conductivity. De-ionized water is a good example of a widely used electronics coolant. Other popular non-dielectric coolant chemistries include Ethylene Glycol (EG), Propylene Glycol (PG), Methanol/Water, Ethanol/Water, Calcium Chloride Solution, and Potassium Formate/Acetate Solution, among others.

Each opening on the sheet that forms the fin 130 can be stamped to form a drawn lip 134. The fins and the internal chamber are integral and the bottom housing, the one or more fins, and the top housing are joined using one of: brazing, soldering, gluing.

The embodiment of FIGS. 3-4 is a low cost, light weight, integral fin-chamber module. The fin 130 utilizes stamped sheet metal parts with pre-punched holes 132 and cold drawn lips 134, when brazed together with end lid and tub, to form a low cost module with internal chamber with integral external fins.

Due to the integral nature of external fin and internal chamber, thermal interface is eliminated (thus enhancing thermal performance). Further, when sheet metal parts are brazed (soldered or glued) together, the joining material itself becomes structural weight supporting elements, thus allowing fabrication of internal chamber and the integral fin to be made with a thin material, therefore yielding a very light module. The total part count of the module can be as low as three and all parts can be joined together through one process whether brazing, soldering or gluing. The resulting heat sink is light and low-cost. The head sink 118 may be manufactured by various processes (e.g., stamping, casting) and made from various materials (e.g., aluminum, copper, bronze). Generally, heat sink 118 should be constructed such that it has a high coefficient of thermal conduction and is of a shape that is adapted to convect or radiate heat at a high rate.

In one embodiment, the heat sink or heat dissipation structure 118 may include an optional heat spreader attached to inactive side of the die through an interface material. The heat spreader enhances heat dissipation for the various components on semiconductor die. The heat spreader is typically made of a metal, for example, copper-tungsten, copper, or aluminum. Copper-tungsten has the advantage of having a similar coefficient of thermal expansion as a silicon substrate. Alternatively, the heat spreader may be made of a plastic containing high conductivity carbon fibers. In general, the heat spreader has a conductivity of approximately 200 watts/meter-K.

Interface material 116 may be any conventional adhesive (paste or tape), grease, solder material or other means of attaching the device 110 to heat sink 118. In general, the interface material 116 should have high dielectric strength, high thermal conductivity and sufficient pliancy to conform to both microscopic and macroscopic surface irregularities of semiconductor die and heat dissipation structure. Interface material 116 should also be sufficiently durable to survive a variety of assembly, use, and environmental conditions. The optimal interface material for a specific application generally depends on volume production requirements, processing limitations, and functional and performance requirements (e.g., thermal transfer rates vs. cost). Some examples of interface material 116 are thermal greases, pads and adhesives with filler materials (i.e., conductive metal particles) such as, but not limited to, zinc oxide, silver, aluminum, aluminum oxide, aluminum nitride, boron nitride, magnesium oxide, and diamond. Other suitable interface materials may also be used. The thickness of interface material 116 needs to be enough to bond semiconductor die (not shown) and heat dissipation structure 118 together, but the exact amount depends on the type of the interface material chosen and the specific application.

Heat sink 118 should preferably be secured to and placed in good thermal contact with electronic device package 110. In one embodiment, heat sink 118 is glued or otherwise adhesively attached to a predetermined surface of electronic device package 110 with a heat-conductive interface material 116 which allows removal of heat from the electronic device package 110. For instance, interface material 116 may be any conventional adhesive (paste or tape), grease, or solder material, the exact amount and material being application specific. Heat sink 118 may also be mechanically attached to electronic device package 110, for example, using clips (not shown). The clips enable the heat sink to be easily removed from the electronic device package.

In one embodiment, various surface treatments may be applied to the exterior surfaces of heat sink 118. Such surface treatments may include, but are not limited to, anodization, electrodeposition, diffusion coating, galvanization, cladding, sprayed metal or paint coatings and conversion coatings as well as various forms of enamels, plastics, rubbers and vacuum-deposited coatings. These treatments are beneficial in that they protect the heat sinks from corrosion caused by moisture or other materials in the environment. In addition, certain of the surface treatments described above enable the heat sinks to be selectively colored which may enhance heat dissipation. For example, darker colors enhance the ability of the heat sinks to radiate heat to the atmosphere during use.

FIGS. 5-6 show a second embodiment of a heat sink that includes a bottom housing or tub 320. Further, a plurality of sheets forming fins 330 are positioned above the tub or bottom housing 320. The bottom housing can receive a coolant existing in a first phase, in one case a liquid. The fins 330 are stacked above the bottom housing and have pipes 332 projecting therethrough to receive a second phase of the coolant. The space defined by the pipes 332 are sealed by a top housing or lid 350 positioned above the one or more fins 332 to define a pipe chamber 340.

The boiling enhancement surface 326 is provided on an inner surface of the bottom housing 320. The boiling enhancement surface forms micro-cracks and provide more space to dissipate heat. In one embodiment, the boiling enhancement is providing using a boiling enhancement coating. Other non-coating surface enhancements such as scratches, machining, or sintering, can be used as a boiling enhancement surface to effect heat removal. In this embodiment, the heat sink uses discrete pipes 332 to be inserted through the holes, in the place of the cavities formed by the sheet metal stacks. The sheet metal stacks in this case may or may not have 'lips' that would otherwise form the cavity when joined in plurality.

In both embodiments, a small tube or multiple tubes 152 can be inserted into various places within the chamber, preferably on the top cap, which will later be used to charge liquid 122 into the chamber and to create a partial vacuum within the chamber after which the tube(s) 152 would be crimped off or otherwise sealed to complete the heat sink module.

FIG. 7 shows an exemplary process for forming a heat sink. The process provides a coolant in a bottom housing, the coolant being a first phase (200). Next, the process receives the coolant in a second phase in an internal chamber defined by one or more fins stacked above the bottom housing and a top housing positioned above the one or more fins (210). The conversion from the first to the second phase is accelerated by applying a boiling enhancement coating on one surface of the bottom housing (220).

In one embodiment, the liquid may be charged to the level higher than the space formed by the bottom housing, in which case the other part of the internal chamber formed by the fins and even the top housing may serve to hold the liquid.

The method can provide boiling heat transfer via direct component immersion in a dielectric liquid as a means of providing heat transfer coefficients large enough to meet forecasted dissipation levels, while maintaining reduced component temperatures. Dielectric liquids (3M Fluorinert family) can be used because they are chemically inert and electrically non-conducting. Their use with boiling heat transfer introduces significant design challenges which include reducing the wall superheat at boiling incipience, enhancing nucleate boiling heat transfer rates, and increasing the maximum nucleate boiling heat flux (CHF). Water can also be used for low cost.

The boiling enhancement coating provides a surface enhancement which creates increased boiling nucleation sites, decreases the incipient superheats, increases the nucleate boiling heat transfer coefficient and increases the critical heat flux. This surface enhancement is particularly advantageous when applied to microelectronic components such as silicon chips that cannot tolerate the high temperature environment required to bond existing heat sinks onto the chip, or mechanical treatments such as sandblasting, and is also particularly advantageous when applied to phase change heat exchanger systems that require chemically stable, strongly bonded surface microstructures. The boiling enhancement coating can be a composition of matter such as a glue, a solvent and cavity-generating particles. This composition is applied to a surface and then cured by low heat or other means, including but not limited to air drying for example, which evaporates the solvent and causes the glue with embedded particles to be bonded to the surface. The embedded particles provide an increased number of boiling nucleation sites. As used herein, "paint" means a solution or suspension which is in liquid or semiliquid form and which may be applied to a surface and when applied, can be cured to adhere to the surface and to form a thin layer or coat on that surface. The paint may be applied by any means such as spread with a brush, dripped from a brush or any other instrument or sprayed, for example. Alternatively, the surface may be dipped into the paint. By curing, is meant that the solvent will be evaporated, by exposure to the rays of a lamp, for example and the remaining composition which includes the suspended particles will adhere to the surface. As used herein, "glue" means any compound which will dissolve in an easily evaporated solvent and will bond to the particles and to the target surface. Some types of glue will be more compatible with certain applications and all such types of such glue will fall within the scope of the present claimed invention. The glue to be used in the practice of the claimed invention would be any glue which exhibits the above mentioned characteristics and which is preferably a synthetic or naturally occurring polymer. Examples of types of glue that could be used in the present invention include ultraviolet activated glue or an epoxy glue, for example. Epoxy glues are well known glues which comprise reactive epoxide compounds which polymerize upon activation. Ultraviolet glues are substances which polymerize upon exposure to ultraviolet rays. Preferably such glues would include 3M 1838-L A/13 and most preferably the thermally conductive epoxies Omegabond 101 or Omegatherm 201 (Omega Engineering, Stamford, Conn.) and the like or any glue which would adhere to the surface and to the particles. Another preferred glue is a brushable ceramic glue. Brushable ceramic glue is a low viscosity, brushable epoxy compound. Preferred brushable ceramic glues have a viscosity of about 28,000 cps and a maximum operating temperature of about 350.degree. F., and most preferred is Devcon Brushable Ceramic Glue. Thermally conductive epoxies are those with thermal conductivities in the range of about 7 to about 15 BTU/(ft.$^2$) (sec) (.degree.F./in). The particles of the present invention may be any particles which would generate cavities on the surface in the manner disclosed herein. As used herein, "cavity-generating particles" means particles which when applied to a surface, or when fixed in a thin film on a surface, form depressions in the surface of from about 0.5 . um to about 10 um in width, which depressions are suitable for promoting boiling nucleation. Preferred particles disclosed herein include crystals, flakes and randomly shaped particles, but could also include spheres or any other shaped particle which would provide the equivalent cavities. The particles are also not limited by composition. Such particles could comprise a compound such as an organic or inorganic compound, a metal, an alloy, a ceramic or combinations of any of these. One consideration is that for certain applications, the particles should be electrically non-conducting. Some preferred particles might comprise silver, iron, copper, diamond, aluminum, ceramic, or an alloy such as brass and particularly preferred particles are silver flakes or, for microelectronic applications, diamond particles, copper particles or aluminum.

In one embodiment, a boiling enhancement composition can include solvent, glue and cavity-generating particles in a ratio of about 10 ml solvent to about 0.1 ml of glue to from about 0.2 grams to about 1.5 grams of cavity-generating particles. Alternatively, the preferred composition is in a ratio of about 10 ml solvent to 0.1 ml of glue to about 1.5 grams of cavity-generating particles. It is understood that compositions of different ratios will be applicable to different utilities and that the ratios disclosed herein are not limiting in any way to the scope of the claimed invention. For example, an embodiment of the present invention is a composition of matter comprising solvent, glue and cavity-generating particles wherein the composition is 85-98% (v/v) solvent, 0.5-2% (v/v) glue and 1.5-15% (w/v) cavity-generating particles. By % (v/v) is meant liquid volume of component divided by total volume of suspension. By % (w/v) is meant grams of component divided by 100 ml of suspension.

The boiling enhancement composition may be added to the surface in any manner appropriate to the particular application. For example, the composition may be painted or dripped onto the surface, or even sprayed onto the surface. Alternatively, the surface or object may be dipped into the composition of the present invention. Following any of these applications, the enhancing composition would then be cured. It is contemplated that the composition of the present invention may also be incorporated into the surface as it is being manufactured and the boiling heat transfer enhancement would be an integral part of the surface. More details on the boiling enhancement coating is described in U.S. Pat. No. 5,814,392, the content of which is incorporated by reference.

While the present invention has been described with reference to particular figures and embodiments, it should be understood that the description is for illustration only and should not be taken as limiting the scope of the invention. Many changes and modifications may be made to the invention, by one having ordinary skill in the art, without departing from the spirit and scope of the invention. For example, additional heat dissipation layers may be added to enhance heat dissipation of the integrated circuit device. Additionally, various packaging types and IC mounting configurations may be used, for example, ball grid array, pin grid array, etc. Furthermore, although the invention has been described in a particular orientations, words like "above," "below," "overlying," "beneath," "up," "down," "height," etc. should not be construed to require any absolute orientation.

The foregoing described embodiments are provided as illustrations and descriptions. They are not intended to limit the invention to the precise form described. In particular, it is contemplated that functional implementation of invention described herein may be implemented equivalently in hardware, software, firmware, and/or other available functional components or building blocks. Other variations and embodiments are possible in light of above teachings, and it is thus intended that the scope of invention not be limited by the description, but rather by the following claims

What is claimed is:

1. A method to remove heat, comprising:
    boiling a coolant in a bottom housing, the coolant being a first phase; and
    receiving the coolant in a second phase in an internal chamber defined by one or more fins stacked between the bottom housing and a top housing, the internal chamber having interconnected vertical recesses therethrough.

2. The method of claim 1, comprising applying a boiling enhancement coating on one surface of the bottom housing.

3. The method of claim 1, comprising providing a boiling enhancement surface having micro-cracks.

4. The method of claim 1, wherein the first phase comprises a liquid phase.

5. The method of claim 1, wherein the second phase comprises a vapor phase.

6. The method of claim 1, wherein the coolant comprises water.

7. The method of claim 1, wherein the coolant comprises a dielectric liquid.

8. The method of claim 1, comprising forming a drawn lip through each opening.

9. The method of claim 1, wherein the fins and the internal chamber are integral.

10. The method of claim 1, comprising joining the bottom housing, the one or more fins, and the top housing using one of: brazing, soldering, gluing, mechanically joining.

* * * * *